(12) United States Patent
McGlynn et al.

(10) Patent No.: US 8,513,518 B2
(45) Date of Patent: Aug. 20, 2013

(54) TERRESTRIAL SOLAR POWER SYSTEM USING III-V SEMICONDUCTOR SOLAR CELLS

(75) Inventors: Daniel McGlynn, Albuquerque, NM (US); Paul R. Sharps, Albuquerque, NM (US); Arthur Cornfeld, Sandia Park, NM (US); Mark Stan, Albuquerque, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 741 days.

(21) Appl. No.: 12/417,367

(22) Filed: Apr. 2, 2009

(65) Prior Publication Data

US 2009/0188546 A1 Jul. 30, 2009

Related U.S. Application Data

(62) Division of application No. 11/500,053, filed on Aug. 7, 2006.

(51) Int. Cl.
*H01L 31/00* (2006.01)

(52) U.S. Cl.
USPC ........... 136/255; 136/252; 136/256; 136/259; 136/262

(58) Field of Classification Search
USPC ................. 136/252, 255, 259, 246, 261, 262, 136/256
See application file for complete search history.

(56) References Cited

U.S. PATENT DOCUMENTS

| | | | | |
|---|---|---|---|---|
| 3,565,719 A | | 2/1971 | Webb | |
| 3,976,508 A | * | 8/1976 | Mlavsky | 136/246 |
| 3,999,283 A | * | 12/1976 | Dean et al. | 438/65 |
| 4,001,864 A | | 1/1977 | Gibbons | |
| 4,338,480 A | | 7/1982 | Antypas et al. | |
| 4,759,803 A | | 7/1988 | Cohen | |
| 5,009,720 A | | 4/1991 | Hokuyo et al. | |
| 5,019,177 A | | 5/1991 | Wanlass | |
| 5,053,083 A | | 10/1991 | Sinton | |
| 5,322,572 A | | 6/1994 | Wanlass | |
| 5,342,453 A | | 8/1994 | Olson | |
| 5,374,317 A | * | 12/1994 | Lamb et al. | 136/246 |
| 5,376,185 A | | 12/1994 | Wanlass | |
| 5,383,976 A | * | 1/1995 | Fraas et al. | 136/253 |
| 5,405,453 A | | 4/1995 | Ho et al. | |
| 5,944,913 A | | 8/1999 | Hou et al. | |

(Continued)

FOREIGN PATENT DOCUMENTS

| | | |
|---|---|---|
| GB | 2 346 010 A | 7/2000 |
| JP | 60-160181 | 8/1985 |

(Continued)

OTHER PUBLICATIONS

Sherif, Raed A. et al.; First Demonstration of Multi-Junction Receivers in a Grid-Connected Concentrator Module; Conf. Rec. 31st IEEE PV Spec. Conf.; Jan. 3-7, 2005; pp. 635-638.

(Continued)

*Primary Examiner* — Jonathan Johnson
*Assistant Examiner* — Lindsey Bernier
(74) *Attorney, Agent, or Firm* — Fish & Richardson P.C.

(57) ABSTRACT

A system for generating electrical power from solar radiation utilizing a thin film III-V compound multijunction semiconductor solar cell mounted on a support in a non-planar configuration.

20 Claims, 4 Drawing Sheets

(56) References Cited

U.S. PATENT DOCUMENTS

| | | | |
|---|---|---|---|
| 6,103,970 | A | 8/2000 | Kilmer et al. |
| 6,239,354 | B1 | 5/2001 | Wanlass |
| 6,252,287 | B1 | 6/2001 | Kurtz et al. |
| 6,278,054 | B1 | 8/2001 | Ho et al. |
| 6,281,426 | B1 | 8/2001 | Olson et al. |
| 6,300,557 | B1 | 10/2001 | Wanlass |
| 6,300,558 | B1 | 10/2001 | Takamoto et al. |
| 6,316,716 | B1 | 11/2001 | Hilgrath |
| 6,326,540 | B1 | 12/2001 | Kilmer et al. |
| 6,340,788 | B1 | 1/2002 | King et al. |
| 6,359,210 | B2 | 3/2002 | Ho et al. |
| 6,372,980 | B1 | 4/2002 | Freundlich |
| 6,384,317 | B1 | 5/2002 | Kerschaver et al. |
| 6,452,086 | B1 | 9/2002 | Müller |
| 6,482,672 | B1 | 11/2002 | Hoffman et al. |
| 6,600,100 | B2 | 7/2003 | Ho et al. |
| 6,660,928 | B1 | 12/2003 | Patton et al. |
| 6,680,432 | B2 | 1/2004 | Sharps et al. |
| 6,951,819 | B2 * | 10/2005 | Iles et al. ............ 438/705 |
| 7,071,407 | B2 | 7/2006 | Faterni et al. |
| 2002/0040727 | A1 | 4/2002 | Stan et al. |
| 2002/0164834 | A1 | 11/2002 | Boutros et al. |
| 2003/0041894 | A1 | 3/2003 | Sverdrup, Jr. et al. |
| 2003/0070707 | A1 | 4/2003 | King et al. |
| 2003/0140962 | A1 | 7/2003 | Sharps et al. |
| 2003/0145884 | A1 | 8/2003 | King et al. |
| 2004/0031517 | A1 | 2/2004 | Bareis |
| 2004/0045598 | A1 | 3/2004 | Narayanan et al. |
| 2004/0149331 | A1 | 8/2004 | Sharps et al. |
| 2004/0261839 | A1 * | 12/2004 | Gee et al. ............ 136/256 |
| 2005/0051205 | A1 | 3/2005 | Mook, Jr. |
| 2005/0274411 | A1 * | 12/2005 | King et al. ............ 136/256 |
| 2006/0144435 | A1 * | 7/2006 | Wanlass ............ 136/249 |
| 2006/0162768 | A1 | 7/2006 | Wanlass et al. |
| 2006/0231130 | A1 | 10/2006 | Sharps et al. |
| 2007/0277873 | A1 | 12/2007 | Cornfeld et al. |
| 2008/0029151 | A1 * | 2/2008 | McGlynn et al. ............ 136/249 |
| 2009/0078308 | A1 * | 3/2009 | Varghese et al. ............ 136/255 |
| 2009/0078309 | A1 * | 3/2009 | Cornfeld et al. ............ 136/255 |
| 2009/0078310 | A1 * | 3/2009 | Stan et al. ............ 136/255 |
| 2009/0078311 | A1 * | 3/2009 | Stan et al. ............ 136/255 |
| 2009/0229658 | A1 * | 9/2009 | Stan et al. ............ 136/255 |
| 2009/0272430 | A1 * | 11/2009 | Cornfeld et al. ............ 136/255 |
| 2009/0288703 | A1 * | 11/2009 | Stan et al. ............ 136/255 |
| 2009/0314348 | A1 * | 12/2009 | McGlynn et al. ............ 136/259 |
| 2010/0012174 | A1 * | 1/2010 | Varghese et al. ............ 136/255 |
| 2010/0012175 | A1 * | 1/2010 | Varghese et al. ............ 136/255 |

FOREIGN PATENT DOCUMENTS

| | | |
|---|---|---|
| JP | 9-64397 | 3/1997 |
| WO | WO 96/18213 | 6/1996 |
| WO | WO 99/62125 | 12/1999 |
| WO | WO 02/080286 A1 | 10/2002 |

OTHER PUBLICATIONS

Cotal, H. et al.; Outdoor Operation of GaInP/GaAs/Ge Triple Junction Concentrator Solar Cells Up to 1000 Suns; 3rd World Conf. on Photovoltaic Energy Conversion; May 11-18, 2003; Osaka, Japan; poster 825-828.

Operation of 350 KW of Amonix High Concentration PV Systems at Arizona Public Service; Proceedings of ISEC 2003; 2003 International Solar Energy Conference; Hawaii, USA; Mar. 15-18, 2003; ISEC2003-44081; pp. 1-6.

Slade, Alexander et al.; High Efficiency Solar Cells for Concentrator Systems: Silicon or Multi-Junction?; SPIE Optics and Photonics; San Diego; Aug. 2005.

Garboushian, Vahan et al., A Novel High-Concentration PV Technology for Cost Competitive Utility Bulk Power Generation; Proc 1st World Conf. on Photovoltaic Energy Conversion; 1994; pp. 1060-1063.

Stone, Kenneth W. et al.; Design & Performance of the Amonix High Concentration Solar PV System; ASES/ASME National Solar Energy Conf.; Reno, NV; 2002.

Wanless, M.W. et al.; Lattice-Mismatched Approaches for High-Performance, III-V Photovoltaic Energy Converters; IEEE 2005; 0-7803-8707-4/05; pp. 530-535.

Luque, A. and Hegedus, S., eds. Handbook of Photovoltaic Science and Engineering. Wiley: Hoboken, NJ. 2003. Sections 9.8 and 9.9 and Chapter 11. 64 pages total. ISBN 1591247748. Ebook accessed through North Carolina State University Libraries. http://catalog.lib.ncsu.edu/web2/tramp2.exe/goto/A1hl1rqj.002?screen=Record.html&server=1home&item=3.

R. Venkatasubramanian et al., *An Inverted-Growth Approach to Development of An IR-Transparent, High-Efficiency AlGaAs/GaAs Cascade Solar Cell*; pp. 93-98.

Sinharoy, S. et al., *Progress in the Development of Metamorphic Multi-Junction III-V Space Solar Cells*; Prog. Photovolt: Res. Appl. vol. 10, 2002, pp. 427-432.

Sopori, Bhushan, "Thin-film Silicon Solar Cells", Handbook of Photovoltaic Science and Engineering edited by Antonio Luque and Steven Hegedus, Chapter 8 (8.1-8.4), pp. 307-357.

* cited by examiner

TERRESTRIAL SOLAR POWER SYSTEM USING III-V SEMICONDUCTOR SOLAR CELLS

REFERENCE TO RELATED APPLICATIONS

This application is a divisional of co-pending U.S. patent application Ser. No. 11/500,053 filed Aug. 7, 2006.

This application is also related to co-pending U.S. patent application Ser. No. 11/109,016 filed Apr. 19, 2005, and Ser. No. 11/280,379 filed Nov. 16, 2005.

This application is also related to co-pending U.S. patent application Ser. No. 11/445,793 filed Jun. 2, 2006 and Ser. No. 12/549,340 filed Aug. 27, 2009 and assigned to the common assignee.

BACKGROUND OF THE INVENTION

1. Field of the Invention

The present invention relates generally to solar power systems for the conversion of sunlight into electrical energy, and, more particularly, to the use of III-V compound semiconductor solar cells.

2. Description of the Related Art

Commercially available silicon solar cells for terrestrial solar power application have efficiencies ranging from 8% to 15%. Compound semiconductor solar cells, based on III-V compounds, have 28% efficiency in normal operating conditions and 32.6% efficiency under concentration. Moreover, it is well known that concentrating solar energy onto the photovoltaic cell increases the cell's efficiency.

Terrestrial solar power systems currently use silicon solar cells in view of their low cost and widespread availability. Although compound semiconductor solar cells have been widely used in satellite applications, in which their power-to-weight efficiencies are more important than cost-per-watt considerations in selecting such devices, such solar cells have not yet been designed and configured for terrestrial systems, nor have terrestrial solar power systems been configured and optimized to utilize compound semiconductor solar cells.

In conventional solar cells constructed with silicon (Si) substrates, one electrical contact is typically placed on a light absorbing or front side of the solar cell and a second contact is placed on the back side of the cell. A photoactive semiconductor is disposed on a light-absorbing side of the substrate and includes one or more p-n junctions, which creates electron flow as light is absorbed within the cell.

The contact on the face of the cell where light enters is generally expanded in the form of a grid pattern over the surface of the front side and is generally composed of a good conductor such as a metal. The grid pattern does not cover the entire face of the cell since grid materials, though good electrical conductors, are generally not transparent to light.

The grid pattern on the face of the cell is generally widely spaced to allow light to enter the solar cell but not to the extent that the electrical contact layer will have difficulty collecting the current produced by the electron flow in the cell. The back electrical contact has not such diametrically opposing restrictions. The back contact simply functions as an electrical contact and thus typically covers the entire back surface of the cell. Because the back contact must be a very good electrical conductor, it is almost always made of metal layer.

The placement of both anode and cathode contacts on the back side of the cell simplifies the interconnection of individual solar cells in a horizontal array, in which the cells are electrically connected in series. Such back contact designs are known from PCT Patent Publication WO 2005/076960 AZ of Gee et al. for silicon cells, and U.S. patent application Ser. No. 11/109,016 filed Apr. 19, 2005, herein incorporated by reference, of the present assignee, for compound semiconductor solar cells.

Another aspect of terrestrial solar power system is the use of concentrators (such as lenses and mirrors) to focus the incoming sun rays onto the solar cell or solar cell array. The geometric design of such systems also requires a solar tracking mechanism, which allows the plane of the solar cell to continuously face the sun as the sun traverses the sky during the day, thereby optimizing the amount of sunlight impinging upon the cell.

Still another aspect of concentrator-based solar power cell configuration design is the design of heat dissipating structures or coolant techniques for dissipating the associated heat generated by the intense light impinging on the surface of the semiconductor body. Prior art designs, such as described in PCT Patent Application No. 02/080286 A1, published Oct. 10, 2002, utilize a complex coolant flow path in thermal contact with the (silicon) photovoltaic cells.

Still another aspect of a solar cell system is the physical structure of the semiconductor material constituting the solar cell. Solar cells are often fabricated in vertical, multijunction structures, and disposed in horizontal arrays, with the individual solar cells connected together in an electrical series. The shape and structure of an array, as well as the number of cells it contains, are determined in part by the desired output voltage and current. One type of multijunction structure useful in the design according to the present invention is the inverted metamorphic solar cell structures, such as described in U.S. Pat. No. 6,951,819, M. W. Wanless et al, Lattice Mismatched Approaches for High Performance, III-V Photovoltaic Energy Converters (Conference Proceedings of the 31.sup.st IEEE Photovoltaic Specialists Conference, Jan. 3-7, 2005, IEEE Press, 2005) and U.S. patent application Ser. No. 11/445,793 of the present assignee, filed Jun. 2, 2006, and herein incorporated by reference

SUMMARY OF THE INVENTION

1. Objects of the Invention

It is an object of the present invention to provide an improved multijunction solar cell.

It is still another object of the invention to provide a solar cell as a thin, flexible film that conforms to a non-planar support.

It is still another object of the invention to provide a solar cell as a thin, flexible film that conforms to the non-planar support of a heat spreader.

It is still another object of the invention to provide a solar cell as a thin, flexible film that conforms to the non-planar image plane of a solar concentrator.

It is still another object of the invention to provide a III-V semiconductor solar cell with a reflective or refractive solar concentrator for terrestrial power applications.

It is still another object of the invention to provide a III-V semiconductor solar cell with a solar tracker for terrestrial power applications.

Some implementations or embodiments of the invention may achieve fewer than all of the foregoing objects.

2. Features of the Invention

Briefly, and in general terms, the invention provides a system for generating electrical power form solar radiation utilizing a III-V compound semiconductor solar cell, a concentrator for focusing sunlight on the solar cell, a solar tracker coupled to said concentrator so as to align the concentrator with the rays of the sun as the sun traverses the sky so that the sunlight is focused on the solar cell, a heat spreader connected to said solar cell for cooling said cell, and an electrical circuit connected to the solar cell for transferring electrical energy from the cell.

In another aspect, the present invention provides a thin, flexible solar cell including a semiconductor body including a first solar subcell having a first band gap; a second solar subcell disposed over the first subcell and having a second band gap smaller than the first band gap; and a grading interlayer disposed over the second subcell, the interlayer having a third band gap larger than the second band gap, and a third solar subcell disposed over the grading interlayer such that the third solar subcell is lattice mismatched with respect to the second subcell and the third subcell has a fourth band gap smaller than the third band gap, and a support for mounting the solar cell in a non-planar configuration so as to capture the sunlight in a concentrator.

Some implementations or embodiments of the patent invention may incorporate only some of the foregoing aspects.

Additional objects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

DESCRIPTION OF THE PREFERRED EMBODIMENT

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The present invention relates generally to terrestrial solar power systems for the conversion of sunlight into electrical energy, and to the use of III-V compound semiconductor solar cells in conjunction with optical components such as reflectors or concentrators which are connected in an array for unitary movement to track the sun.

Figure 1:
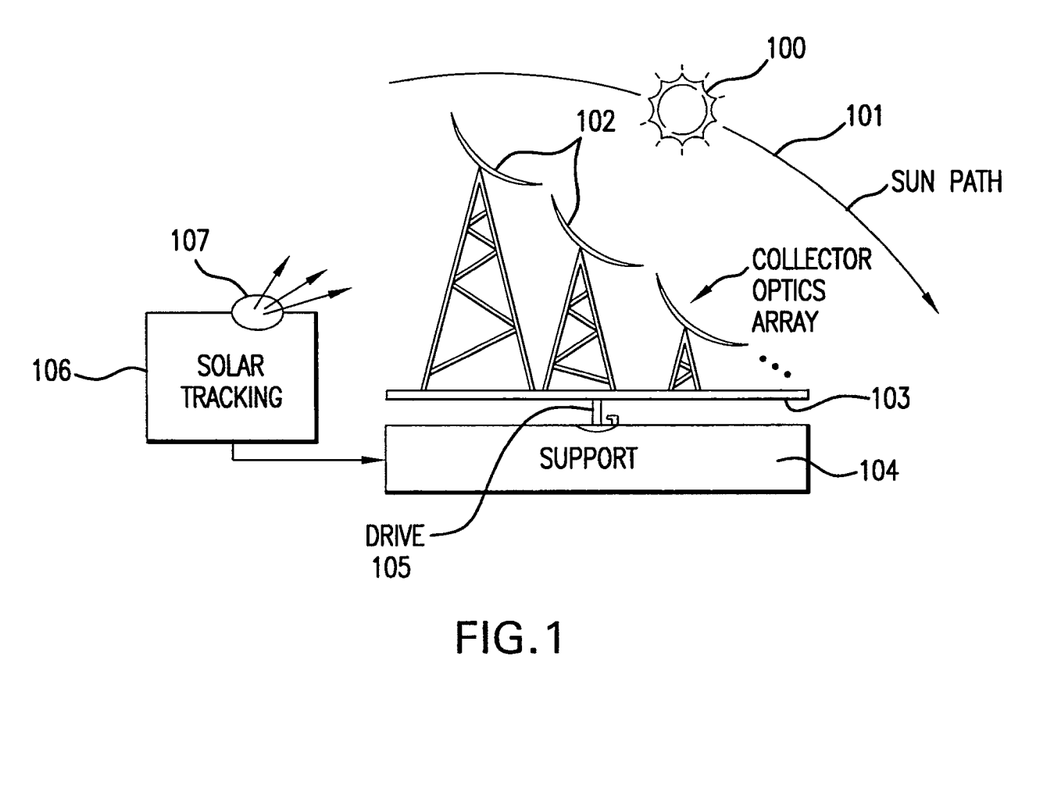
FIG. 1 shows a highly simplified block diagram of a terrestrial solar cell system under an illustrated embodiment of the invention.

In one aspect, the invention relates to the design of a solar power system as depicted in FIG. 1. FIG. 1 depicts the sun 100 traversing the sky along a path 101 which varies with latitude and day of the year. Solar collectors 102 are pointed at the sun so as to maximize the exposure of the solar cells (not shown) directly to the sun's parallel incoming rays. The collectors 102 may be organized as an array which is mounted on a rotatable platform 103 to allow the array to track the sun 100 as the sun moves during the day. The platform 103 is in turn mounted on a fixed support 104 which may be mounted on a building or other terrestrial structure. The support 104 may include electrical circuitry to transfer the electrical current supplied by the array 102 to a battery, power distribution system, or grid.

A solar tracking arrangement 106 is provided which may either store solar angle data in a database, or utilize photodetectors or other optical components 107 to detect the position of the sun 100. The tracking arrangement processes the stored or detected sun angle information, and transmits appropriate control signals to the support 104 to cause the platform 103 and collector optics array 102 to be continuously positioned both in azimuth and altitude angles by means of a drive 105, schematically shown in the Figure. A variety of solar tracking arrangements are known to those skilled in the art, and therefore need not be described in detail here.

Figure 2:
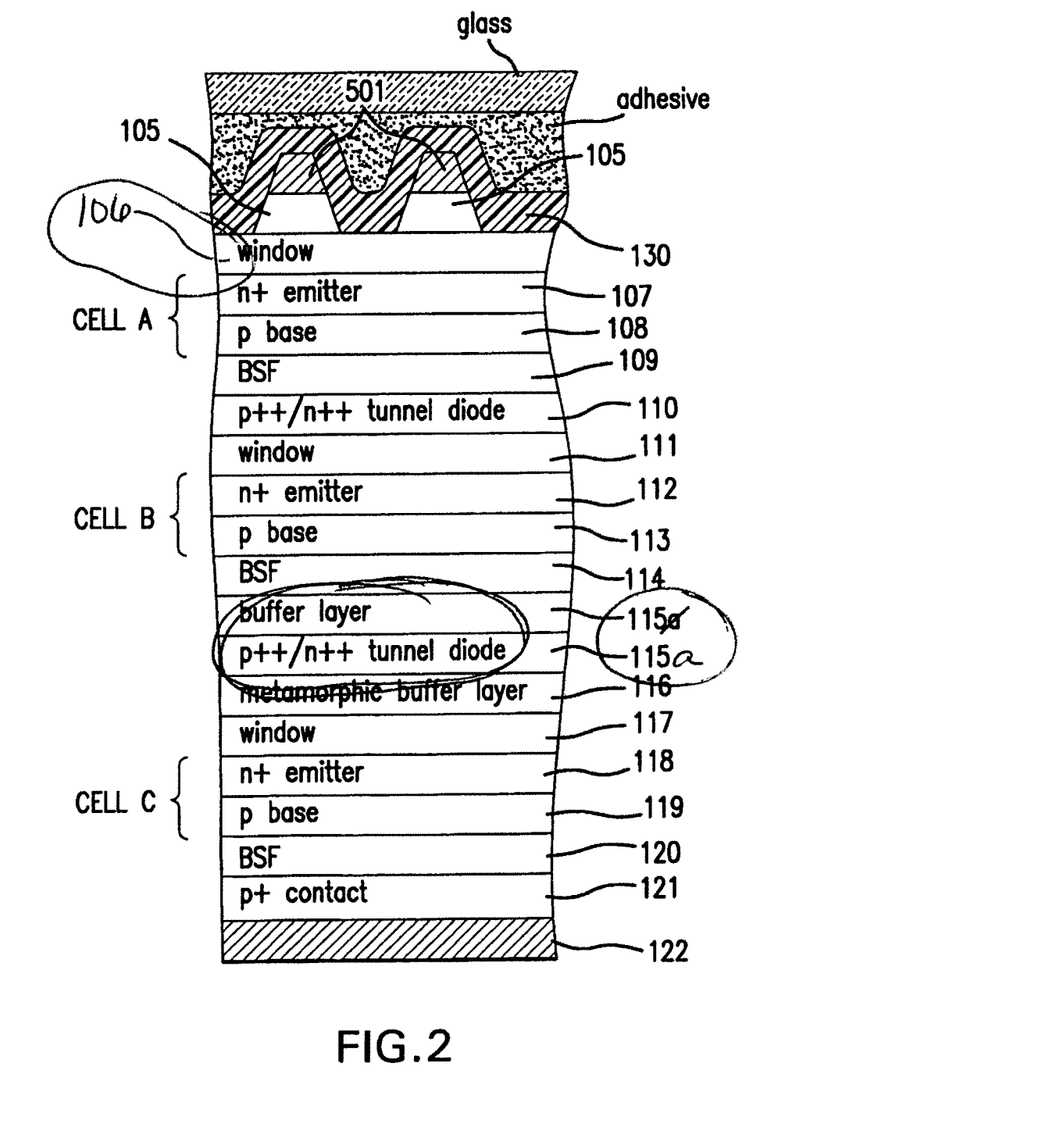
FIG. 2 shows a cross-sectional view of an inverted metamorphic solar cell that may be used in the present invention.

FIG. 2 depicts the multijunction inverted metamorphic solar cell that may be used in one embodiment of the present invention, including three subcells A, B and C. More particularly, the solar cell is formed using the process in U.S. patent application Ser. No. 11/445,793 filed Jun. 2, 2006. As shown in the Figure, the top surface of the solar cell includes grid lines 501 which are directly deposited over the contact layer 105. An antireflective (ARC) dielectric layer 130 is deposited over the entire surface of the solar cell. An adhesive is deposited over the ARC layer to secure a cover glass. The solar cell structure includes a window layer 106 adjacent to the contact layer 105. The subcell A, consisting of an n+ emitter layer 107 and a p-type base layer 108, is then formed on the window layer 106.

In one of the preferred embodiments, the n+ type emitter layer 107 is composed of InGA(Al)P, and the base layer 108 is composed of InGa(Al)P.

Adjacent to the base layer 108 is deposited a back surface field ("BSF") layer 109 used to reduce recombination loss. The BSF layer 109 drives minority carriers from the region near the base/BSF interface surface to minimize the effect of recombination loss.

On the BSF layer 109 is deposited a sequence of heavily doped p-type and n-type layers 110 which forms a tunnel diode, a circuit element that functions to electrically connect cell A to cell B.

On the tunnel diode layers 110 a window layer 111 is deposited. The window layer 111 used in the subcell B also operates to reduce the recombination loss. The window layer 111 also improves the passivation of the cell surface of the underlying junctions. It should be apparent to one skilled in the art, that additional layer(s) may be added or deleted in the cell structure without departing from the scope of the present invention.

On the window layer 111 of cell B are deposited: the emitter layer 112, and the p-type base layer 113. These layers in one embodiment are preferably composed of InGaP and $In_{0.015}GaAs$ respectively, although any other suitable materials consistent with lattice constant and band gap requirements may be used as well.

On cell B is deposited a BSF layer 114 which performs the same function as the BSF layer 109. A p++/n++ tunnel diode 115 is deposited over the BSF layer 114 similar to the layers 110, again forming a circuit element that functions here to electrically connect cell B to cell C. A buffer layer 115a, preferably InGaAs, is deposited over the tunnel diode 115 and has a thickness of about 1.0 micron. A metamorphic buffer layer 116 is deposited over the buffer layer 115a which is preferably a compositionally step-graded InGaAlAs series of layers with monotonically changing lattice constant to achieve a transition in lattice constant from cell B to subcell C. The bandgap of layer 116 is 1.5 ev constant with a value slightly greater than the bandgap of the middle cell B.

In one embodiment, as suggested in the Wanless et al. paper, the step grade contains nine compositionally graded steps with each step layer having a thickness of 0.25 micron. In one of the preferred embodiments, the interlayer is composed of InGaAlAs, with monotonically changing lattice constant, such that the bandgap remains constant at 1.50 ev.

Over the metamorphic buffer layer 116 is a window layer 117 composed of $In_{0.78}GaP$, followed by subcell C having n+ emitter layer 118 and p-type base layer 119. These layers in one embodiment are preferably composed of $In_{0.30}GaAs$.

A BSF layer 120 is deposited over base layer 119. The BSF layer 120 performs the same function with respect to cell C as BSF layers 114 and 109.

A p+ contact layer 121 is deposited over BSF layer 120 and a metal contact layer 122, preferably a sequence of Ti/Au/Ag/Au layers is applied over layer 121.

Figure 3:
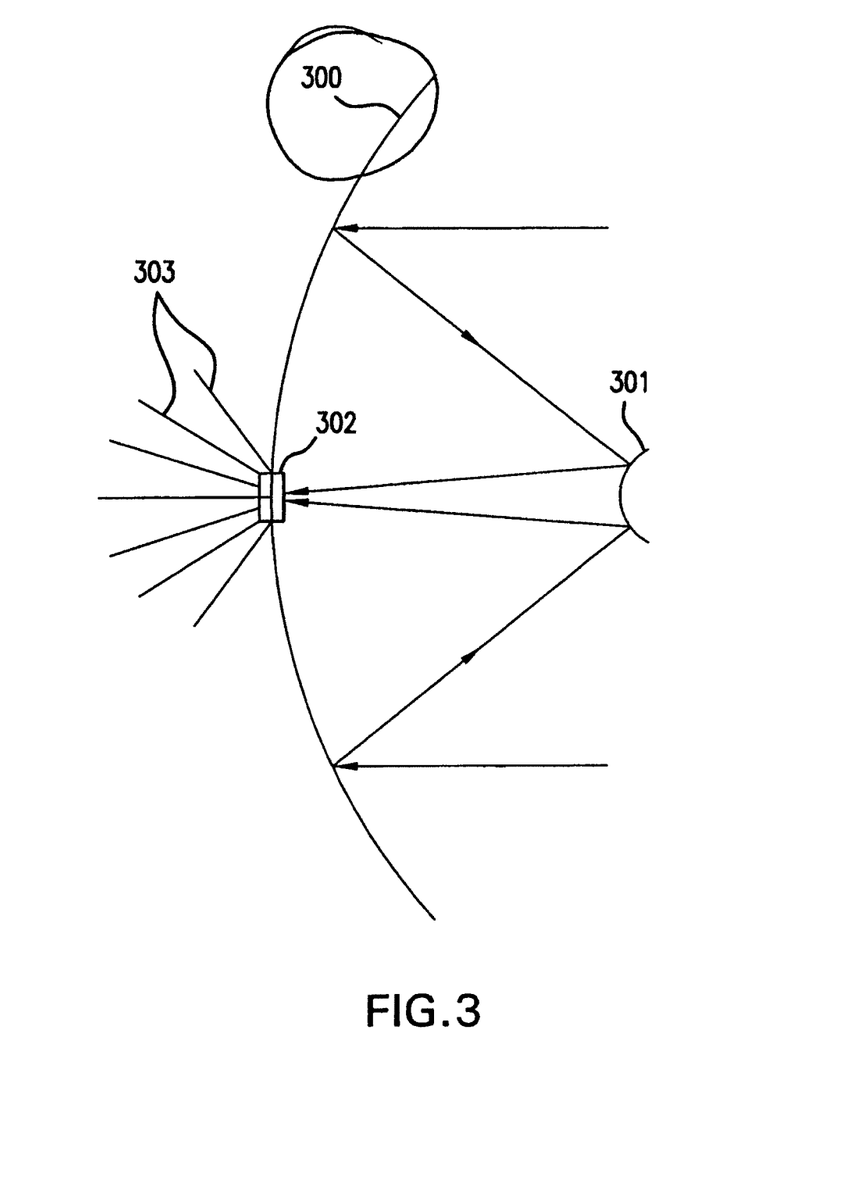
FIG. 3 shows an enlarged cross-sectional view of a first embodiment of the collection optics used in the present invention.

FIG. 3 is a view of a first embodiment of the present invention using a Cassegrain reflector arrangement. In such an arrangement, the solar cell 204 may be mounted in the center of the reflector 301, and a passive heat spreader 302, with cooling fins 303, may be provided.

In most general terms, the solar cell module is a thin film semiconductor body including a multifunction solar cell which in some embodiments have first and second electrical contacts on the back surface thereof. The module includes a support for mounting the solar cell and making electrical contact with the first and second contacts. A heat spreader 302 is attached to the support of the reflector 301 for dissipating heat from the semiconductor body.

Figure 4:
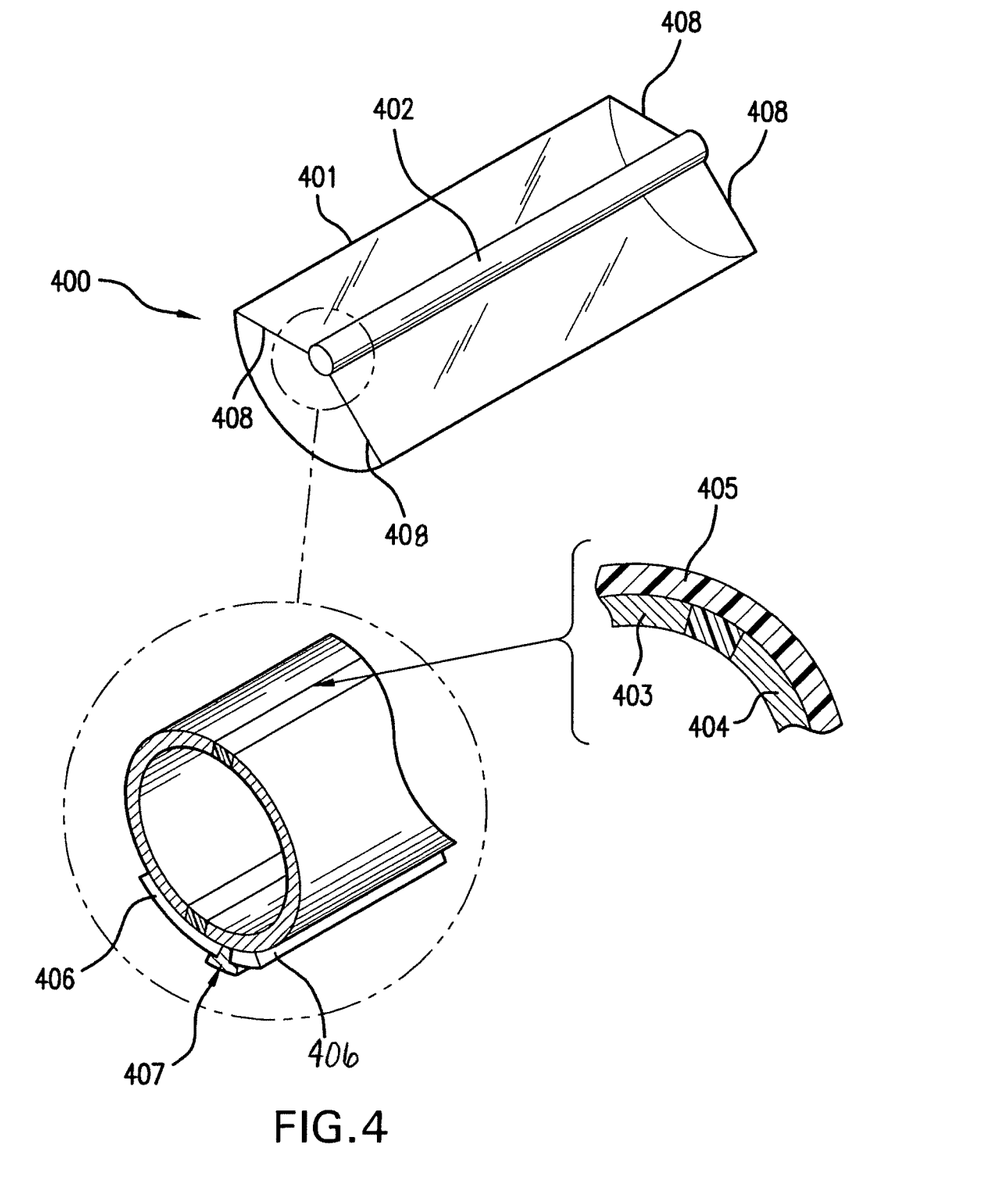
FIG. 4 shows a cross-sectional view of a second embodiment of the collection optics used in the present invention.

FIG. 4 is an enlarged view of a parabolic trough solar collector 400 according to a second embodiment of the present invention. The trough 401 is one embodiment of the collector optics 102, the trough 401 is positioned to face the sun so that the incoming parallel rays are focused at a focal point along a line, approximately at the center of tube element 402. In one embodiment, the solar cell 406 (such as described in FIG. 2) may be mounted and supported by the tube 402. The tube 402 may be composed of two electrically isolated elements 403 and 404 supported by a dielectric outer support 405. The metallic elements 403 and 404 function as a heat spreader, and may be filled with a circulating liquid to provide even greater cooling to the solar cell 406. The tube 402 is suspended at the focal point by means of a support bracket 408.

One aspect of the present invention depicted in FIG. 4 is that the solar cell 406 is a flexible thin film and shaped so as to conform to the surface of the tube 402, which has a non-planar configuration, in this embodiment being cylindrical. The design of the solar cell 406 may include a metal via 407 which makes an electrical connection between the top surface of the cell 406 and element 404. The bottom surface of the cell 406 makes electrical contact with element 403.

Although this invention has been described in certain specific embodiments, many additional modifications and variations would be apparent to those skilled in the art. The present invention is therefore considered in all respects to be illustrative and not restrictive. The scope of the invention is indicated by the appended claims, and all changes that come within the meaning and range of equivalents thereof are intended to be embraced therein.

It will be understood that each of the elements described above, or two or more together, also may find a useful application in other types of constructions differing from the types described above.

While the invention has been illustrated and described as embodied in a solar power system using III-V compound semiconductors, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and therefore, such adaptations should and are intended to be comprehended within the meaning and range of equivalence of the following claims.

What is claimed is:

1. A solar cell assembly comprising
a solar cell including a thin flexible film semiconductor body formed from III-V compound semiconductors including:
a first solar subcell having a first band gap,
a second solar subcell disposed over the first subcell and having a second band gap smaller than the first band gap,
a grading interlayer composed of InGaAlAs and disposed over the second subcell in said body and having a third band gap greater than the second band gap, and
a third solar subcell over said interlayer in the body and being lattice mismatched with respect to the second subcell and having a fourth band gap smaller than the third band gap; and
a non-planar support for mounting the solar cell, wherein the solar cell is shaped to conform to a non-planar surface of the non-planar support.

2. A solar cell assembly as defined in claim 1, wherein said support is attached to a heat spreader.

3. A solar cell assembly as defined in claim 2, wherein the heat spreader is a metal structure with cooling fins.

4. A solar cell assembly as defined in claim 1, wherein said support is a portion of a solar concentrator that forms a Cassegrain reflector.

5. A solar cell assembly as defined in claim 1, wherein the grading interlayer has a substantially constant band gap.

6. A solar cell assembly as defined in claim 5 wherein the constant band gap of the grading interlayer is 1.5 eV.

7. A solar cell assembly as defined in claim 1, wherein the grading interlayer has a monotonically changing lattice constant.

8. A solar cell assembly as defined in claim 7, wherein the grading interlayer is a compositionally step-graded InGaAlAs series of layers with monotonically changing lattice constant.

9. A solar cell assembly as defined in claim 1 wherein the first solar subcell includes an InGa(Al)P emitter region and an InGa(Al)P base region.

10. A solar cell assembly as defined in claim 1 wherein the second solar subcell includes an InGaP emitter layer.

11. A solar cell assembly as defined in claim 10 wherein the second solar subcell further includes an InGaAs base layer.

12. A solar cell assembly as defined in claim 11 wherein the InGaAs base layer is composed of $In_{0.015}GaAs$.

13. A solar cell assembly as defined in claim 1 wherein the third solar subcell includes emitter and base layers composed of InGaAs.

14. A solar cell assembly as defined in claim 13 wherein the InGaAs base layers are composed of $In_{0.30}GaAs$.

15. A solar cell assembly as defined in claim 1 further comprising:
   a tunnel diode disposed over the second solar subcell, and
      a buffer layer disposed between the tunnel diode and the grading interlayer.

16. A solar cell assembly as defined in claim 15 wherein the buffer layer between the tunnel diode and the grading interlayer is composed of InGaAs.

17. A solar cell assembly as defined in claim 15 wherein the buffer layer has a thickness of about 1.0 micron.

18. A solar cell assembly as defined in claim 1 further including a metal contact layer over the third solar subcell.

19. A solar cell assembly as defined in claim 18, wherein the metal contact layer includes a sequence of Ti/Au/Ag/Au layers.

20. A solar cell assembly as defined in claim 19, wherein the grading interlayer is a compositionally step-graded InGaAlAs series of layers with monotonically changing lattice constant that achieves a transition in lattice constant from the second solar subcell to the third solar subcell.

* * * * *

UNITED STATES PATENT AND TRADEMARK OFFICE
CERTIFICATE OF CORRECTION

Page 1 of 3

PATENT NO. : 8,513,518 B2
APPLICATION NO. : 12/417367
DATED : August 20, 2013
INVENTOR(S) : Daniel McGlynn It is certified that error appears in the above-identified patent and that said Letters Patent is hereby corrected as shown below:

Delete the title page, and substitute therefor the attached title page with the corrected figure.

In the drawings, Sheet 2, replace FIG. 2 with the following:

FIG.2

Signed and Sealed this
Twenty-ninth Day of April, 2014

Michelle K. Lee
*Deputy Director of the United States Patent and Trademark Office*

In the drawings, Sheet 3, replace FIG. 3 with the following:

FIG.3

CERTIFICATE OF CORRECTION (continued)

(12) United States Patent
McGlynn et al.

(10) Patent No.: US 8,513,518 B2
(45) Date of Patent: Aug. 20, 2013

(54) TERRESTRIAL SOLAR POWER SYSTEM USING III-V SEMICONDUCTOR SOLAR CELLS

(75) Inventors: Daniel McGlynn, Albuquerque, NM (US); Paul R. Sharps, Albuquerque, NM (US); Arthur Cornfeld, Sandia Park, NM (US); Mark Stan, Albuquerque, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 741 days.

(21) Appl. No.: 12/417,367

(22) Filed: Apr. 2, 2009

(65) Prior Publication Data

US 2009/0188546 A1 Jul. 30, 2009

Related U.S. Application Data

(62) Division of application No. 11/500,053, filed on Aug. 7, 2006.

(51) Int. Cl.
*H01L 31/00* (2006.01)

(52) U.S. Cl.
USPC ........... 136/255; 136/252; 136/256; 136/259; 136/262

(58) Field of Classification Search
USPC ................ 136/252, 255, 259, 246, 261, 262, 136/256
See application file for complete search history.

(56) References Cited

U.S. PATENT DOCUMENTS

| | | | |
|---|---|---|---|
| 3,565,719 A | | 2/1971 | Webb |
| 3,976,508 A | * | 8/1976 | Mlavsky .................. 136/246 |
| 3,999,283 A | * | 12/1976 | Dean et al. ................. 438/65 |
| 4,001,864 A | | 1/1977 | Gibbons |
| 4,338,480 A | | 7/1982 | Antypas et al. |
| 4,759,803 A | | 7/1988 | Cohen |
| 5,009,720 A | | 4/1991 | Hokuyo et al. |
| 5,019,177 A | | 5/1991 | Wanlass |
| 5,053,083 A | | 10/1991 | Sinton |
| 5,322,572 A | | 6/1994 | Wanlass |
| 5,342,453 A | | 8/1994 | Olson |
| 5,374,317 A | * | 12/1994 | Lamb et al. ............... 136/246 |
| 5,376,185 A | | 12/1994 | Wanlass |
| 5,383,976 A | * | 1/1995 | Fraas et al. ............... 136/253 |
| 5,405,453 A | | 4/1995 | Ho et al. |
| 5,944,913 A | | 8/1999 | Hou et al. |

(Continued)

FOREIGN PATENT DOCUMENTS

GB 2 346 010 A 7/2000
JP 60-160181 8/1985

(Continued)

OTHER PUBLICATIONS

Sherif, Raed A. et al.; First Demonstration of Multi-Junction Receivers in a Grid-Connected Concentrator Module; Conf. Rec. 31st IEEE PV Spec. Conf.; Jan. 3-7, 2005; pp. 635-638.

(Continued)

*Primary Examiner* — Jonathan Johnson
*Assistant Examiner* — Lindsey Bernier
(74) *Attorney, Agent, or Firm* — Fish & Richardson P.C.

(57) ABSTRACT

A system for generating electrical power from solar radiation utilizing a thin film III-V compound multijunction semiconductor solar cell mounted on a support in a non-planar configuration.

20 Claims, 4 Drawing Sheets